United States Patent
Oberg et al.

(10) Patent No.: US 9,191,031 B2
(45) Date of Patent: *Nov. 17, 2015

(54) METHOD AND APPARATUS FOR READING A DISC

(71) Applicant: MARVELL WORLD TRADE LTD., St. Michael (BB)

(72) Inventors: Mats Oberg, Cupertino, CA (US); Jin Xie, Longmont, CO (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/617,070

(22) Filed: Feb. 9, 2015

(65) Prior Publication Data

US 2015/0155887 A1    Jun. 4, 2015

Related U.S. Application Data

(63) Continuation of application No. 13/722,007, filed on Dec. 20, 2012, now Pat. No. 8,954,819.

(60) Provisional application No. 61/582,943, filed on Jan. 4, 2012.

(51) Int. Cl.
| | |
|---|---|
| *H03M 13/00* | (2006.01) |
| *G11C 29/00* | (2006.01) |
| *H03M 13/29* | (2006.01) |
| *H03M 13/05* | (2006.01) |
| *G11B 20/18* | (2006.01) |
| *G06F 11/10* | (2006.01) |

(52) U.S. Cl.
CPC ........... *H03M 13/29* (2013.01); *G06F 11/1076* (2013.01); *G11B 20/1813* (2013.01); *G11B 20/1833* (2013.01); *H03M 13/05* (2013.01)

(58) Field of Classification Search
None
See application file for complete search history.

(56) References Cited

U.S. PATENT DOCUMENTS

| 5,237,574 | A | 8/1993 | Weng | |
|---|---|---|---|---|
| 7,200,795 | B2 | 4/2007 | Stek et al. | |
| 7,281,193 | B2 | 10/2007 | Wu et al. | |
| 7,958,426 | B2 * | 6/2011 | Betts | 714/755 |
| 8,032,812 | B1 | 10/2011 | Yang et al. | |
| 8,069,391 | B1 * | 11/2011 | Wu et al. | 714/758 |
| 8,352,837 | B1 | 1/2013 | Zhu et al. | |
| 2005/0034047 | A1 | 2/2005 | Stek et al. | |
| 2006/0069979 | A1 | 3/2006 | Wu et al. | |

* cited by examiner

*Primary Examiner* — Daniel McMahon

(57) ABSTRACT

Aspects of the disclosure provide a circuit that includes a decoder, an error checking module, and a controller. The decoder is configured to receive codewords, and decode the codewords based on an error correcting code. The error checking module is configured to error-check sectors using an error detecting code in the sectors. Each sector is formed of a plurality of decoded codewords. The controller is configured to store in a memory, when the error checking fails for at least one sector, the decoded codewords and corresponding flags indicative of pass or fail of the decoding of the codewords.

17 Claims, 8 Drawing Sheets

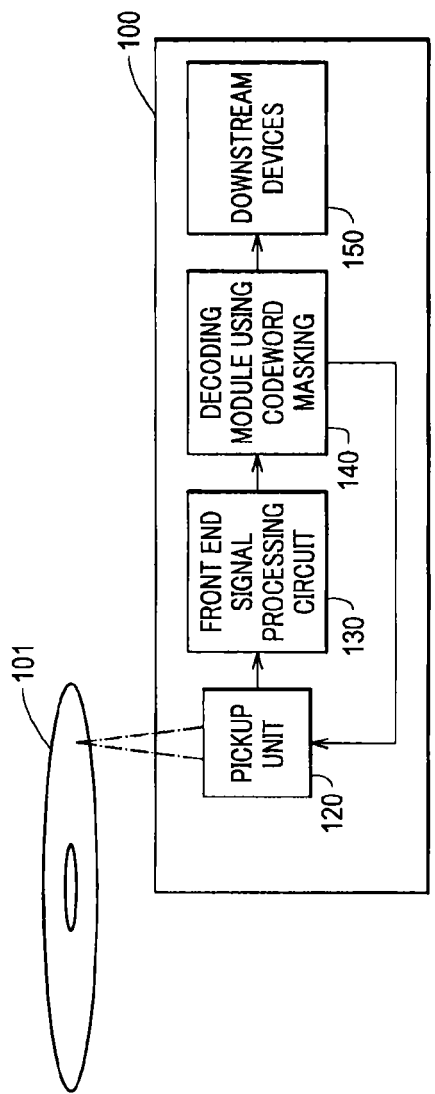
FIG. 1
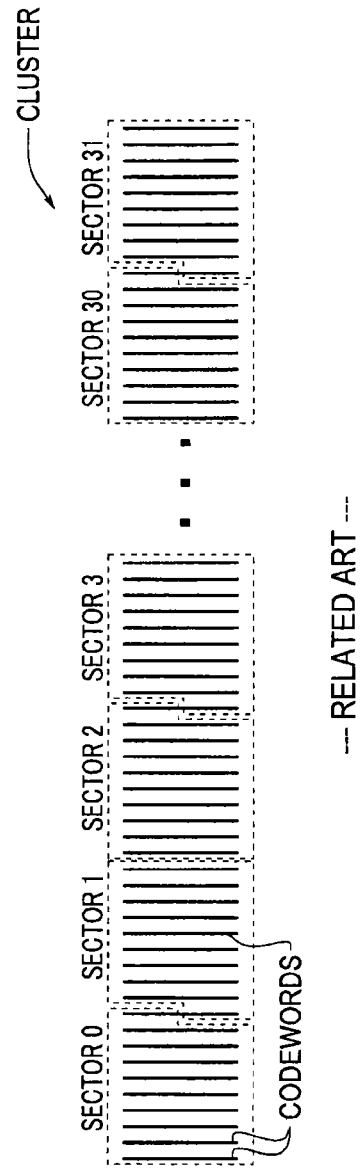
FIG. 2 — RELATED ART —

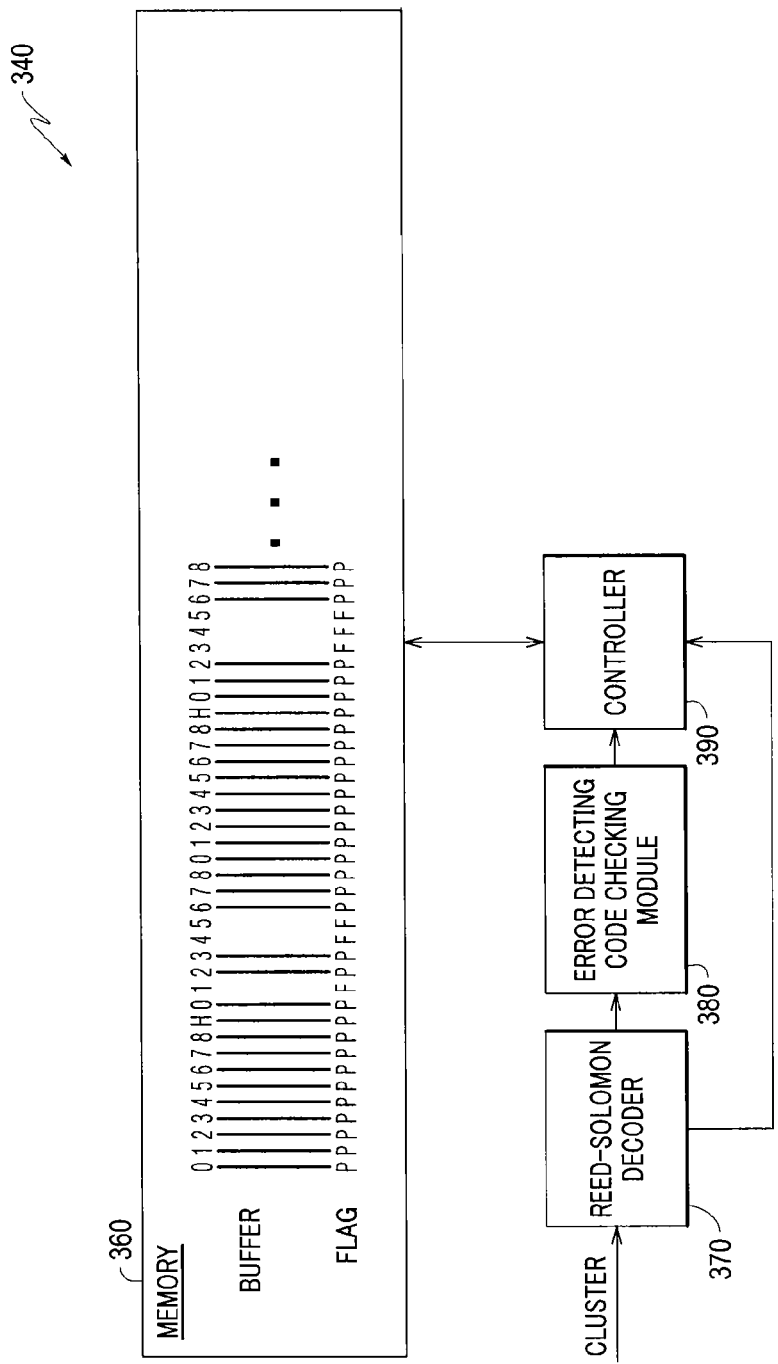

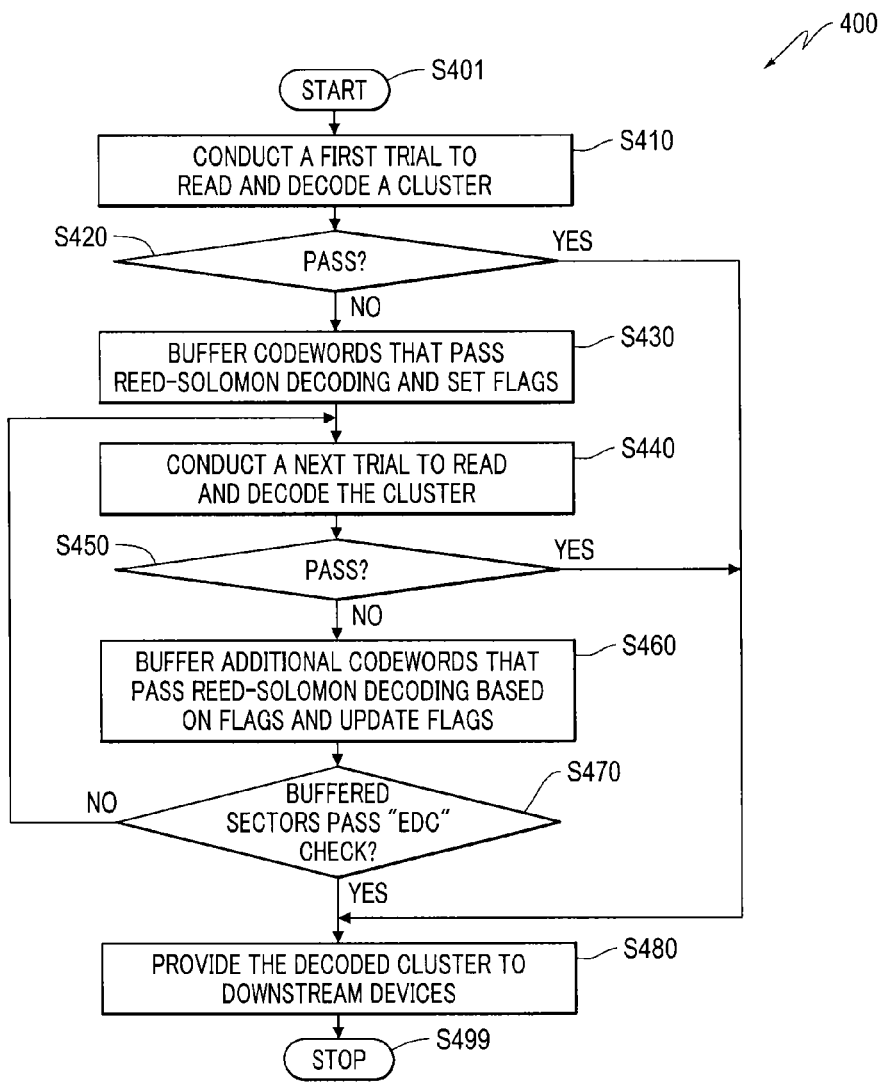

METHOD AND APPARATUS FOR READING A DISC

INCORPORATION BY REFERENCE

This application is a continuation of U.S. application Ser. No. 13/722,007, filed on Dec. 20, 2012, which claims the benefit of U.S. Provisional Application No. 61/582,943, filed on Jan. 4, 2012. The disclosures of the applications referenced above are incorporated herein by reference in their entireties.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, data stored on an optical disc is encoded with error detecting code and/or error correcting code. The error detecting code can be used to detect errors, and the error correcting code can be used to correct certain errors.

SUMMARY

Aspects of the disclosure provide a circuit that includes a decoder, an error checking module, and a controller. The decoder is configured to receive codewords, and decode the codewords based on an error correcting code. The error checking module is configured to error-check sectors using an error detecting code in the sectors. Each sector is formed of a plurality of decoded codewords. The controller is configured to store in a memory, when the error checking fails for at least one sector, the decoded codewords and corresponding flags indicative of pass or fail of the decoding of the codewords.

In an embodiment, the codewords are first codewords, and the sectors are first sectors. Further, the decoder is configured to receive second codewords, and decode the second codewords based on the error correcting code. The error checking module is configured to error-check second sectors using error detecting code in the second sectors. Each second sector is formed of a plurality of decoded second codewords. The controller is configured to store in the memory, when the error checking of the second sectors fails for at least one sector, the decoded second codewords based on the stored flags in the memory to combine the decoded first codewords with the decoded second codewords.

In an example, the controller is configured to store a decoded second codeword when a corresponding flag indicates that the decoding of a corresponding first codeword fails. Further, the error checking module is configured to error-check sectors in the memory that combine the decoded first codewords and the decoded second codewords.

Further, in an embodiment, the decoder is configured to receive the codewords in response to reading a cluster of data from a Blu-ray disc. In an example, the cluster includes 32 sectors, and each sector includes nine and half codewords.

According to an aspect of the disclosure, the controller is configured to store scores of the codewords that are indicative of pass or fail of the corresponding sector error checking in the memory. Further, the controller is configured to store a score of a shared codeword of two sectors based on sector error checking of the two sectors.

Aspects of the disclosure also provide a method. The method includes receiving codewords, decoding the codewords based on an error correcting code, error-checking sectors using an error detecting code in sectors, and storing in a memory the decoded codewords and corresponding flags indicative of pass or fail of the codewords decoding when the error checking fails for at least one sector.

Aspects of the disclosure also provide an apparatus that includes an optical pickup unit, a decoder, an error checking module, and a controller. The optical pickup unit is configured to generate an electrical signal in response to reading a Blu-ray disc. The decoder is configured to receive codewords extracted from the electrical signal, and decode the codewords based on an error correcting code. The error checking module is configured to error-check sectors using an error detecting code in the sectors. Each sector is formed of a plurality of decoded codewords. The number of codewords in a sector does not have to be integer. The controller is configured to store in a memory, when the error checking fails for at least one sector, the decoded codewords and corresponding flags indicative of pass or fail of the decoding of the codewords.

BRIEF DESCRIPTION OF THE DRAWINGS

Various embodiments of this disclosure that are proposed as examples will be described in detail with reference to the following figures, wherein like numerals reference like elements, and wherein:

FIG. 1 shows a block diagram of an electronic system example 100 and a storage medium example 101 according to an embodiment of the disclosure;

FIG. 2 shows a plot illustrating a cluster of data according to a Blu-ray format;

FIG. 3A shows a block diagram of a decoding module 340 according to an embodiment of the disclosure;

FIG. 4 shows a flowchart outlining a process example 400 executed by the decoding module 340 according to an embodiment of the disclosure;

DETAILED DESCRIPTION OF EMBODIMENTS

Figure 3B:
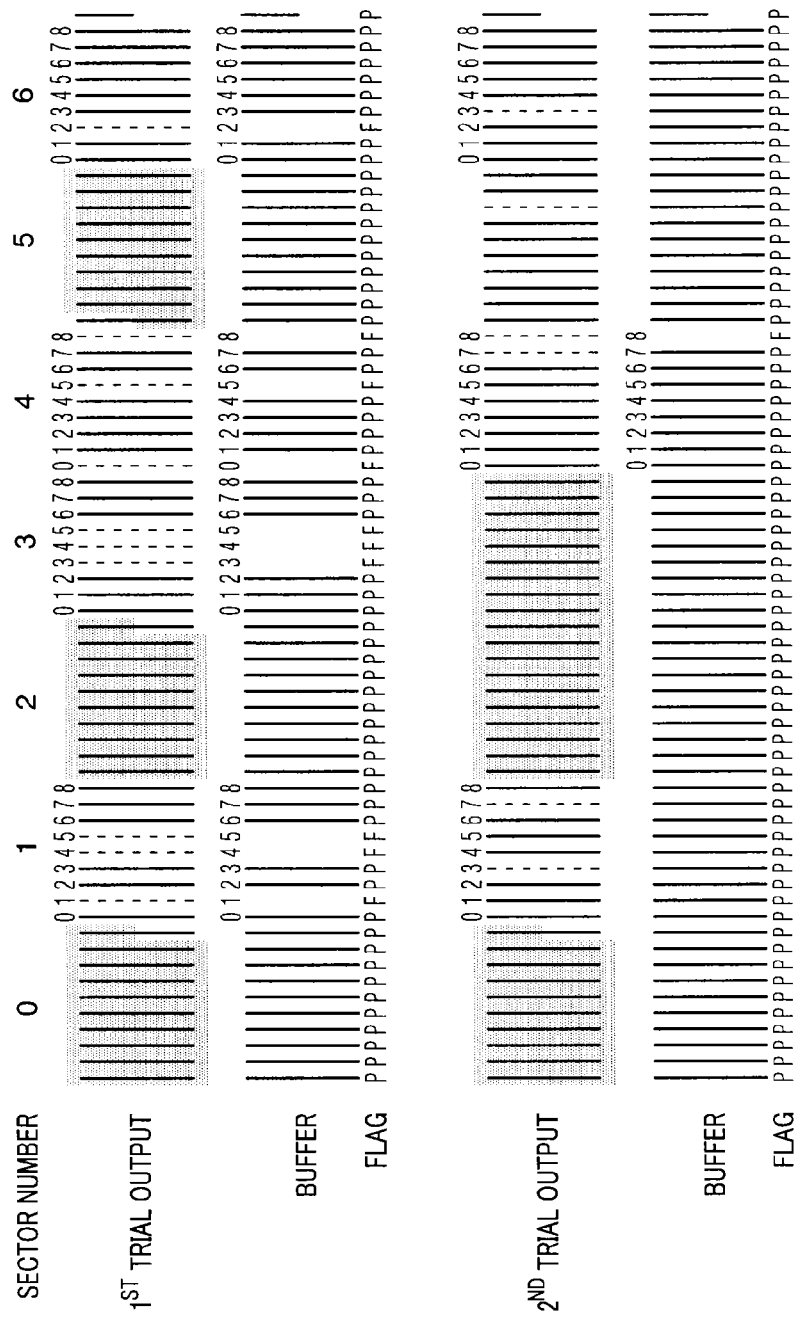
FIG. 3B shows an example for the decoding module 340 to combine the decoded codewords from multiple trials for reading a cluster.

FIG. 1 shows a block diagram of an electronic system example 100 and a storage medium example 101 according to an embodiment of the disclosure. The electronic system 100 includes a pick-up unit 120 coupled with the storage medium 101 to receive a signal corresponding to information stored on the storage medium 101. The electronic system 100 processes the signal and extracts the information from the signal. The electronic system 100 includes various components, such as a front-end signal processing circuit 130, a decoding module 140, and devices 150 that are downstream of the decoding module 140. These elements are coupled together as shown in FIG. 1.

Generally, data stored on the storage medium 101 is encoded with error detecting code and/or error correcting code. The error detecting code and the error correcting code can be used at different sizes of data units. In an example, error correcting code is used in relatively small size of data unit to correct errors in the data unit, and the error detecting code is used for detecting errors in relatively large size of data unit. According to an aspect of the disclosure, the decoding module 140 is configured to use decoding mask for indicating decoding history at the relatively small size of data unit to enable combining data from multiple read trials at the relatively small size of data unit to improve performance when the signal quality is poor, and thus to improve user experience.

In addition, in an embodiment, the decoding module 140 can use both the decoding mask for the relatively small size of data unit and a decoding mask for the relatively large size of data unit to enable combining data from multiple read trials.

In an example, the storage medium 101 is a Blu-ray disc that stores information as optical property changes. According to a Blu-ray format, data is organized in clusters.

FIG. 2 shows a plot illustrating a cluster of data according to a Blu-ray format. The cluster includes 32 sectors. Each sector has 2,048 user bytes and four bytes of error detecting code (EDC). The EDC bytes are generated as a function of the 2,048 user bytes. Further, the total 2052 bytes are organized into nine and half codewords. Two neighboring sectors may share a codeword. Each codeword includes 216 bytes. In the FIG. 2 example, each column represents a codeword. The codeword is then encoded by an error correcting code for error correction. For example, the 216 bytes of a codeword can be encoded by a Reed-Solomon code RS(248, 216) to generate an encoded codeword of 248 bytes. After being encoded with the error detecting code and error correcting code, the cluster is stored on the Blu-ray disc 101 as optical property changes.

According to an aspect of the disclosure, the information stored on the Blu-ray disc 101 is then read by the electronic system 100 in the unit of cluster. Specifically, in an example, the pick-up unit 120 is an optical pickup unit (OPU) 120 that can be optically coupled with the Blu-ray disc 101, and can generate an electrical signal in response to the optical property changes on the Blu-ray disc 101. For example, the OPU 120 directs a light beam to a portion of the Blu-ray disc 101 that stores a cluster to read. The light beam is reflected from the Blu-ray disc 101, and has light properties that correspond to the optical property changes on the Blu-ray disc 101. The OPU 120 generates the electrical signal in response to the light properties of the reflected light beam. The electrical signal is then processed by the front-end signal processing circuit 130 to extract a bit stream corresponding to the cluster stored on the Blu-ray disc 101.

The front-end signal processing circuit 130 includes various circuits, such as analog circuits, digital circuits and the like to extract the bit stream. For example, after processing the electrical signal using analog techniques, an analog to digital converter (ADC) converts the electrical signal from an analog form to a digital form. Further, the front-end signal processing circuit 130 includes a detector, such as a Viterbi detector and the like, to detect the bit stream from the digital form of the electrical signal.

The bit stream may have errors due to various reasons, such as disc manufacturing defects, dusts, finger prints, environmental noise, and the like. The decoding module 140 performs cluster decoding on the bit stream to detect and correct errors. For example, the decoding module 140 receives a bit stream corresponding to a cluster stored on the Blu-ray disc 101, decodes codewords in the bit stream according to the Reed-Solomon code, and then performs error detecting code checking in sectors according to the error detecting code in each sector.

When all of the 32 sectors pass the error detecting code checking, the cluster formed by the sectors is provided to the devices 150 that are downstream of the decoding module 140. When at least one sector fails the error detecting code checking, the decoding module 140 informs the OPU 120, and the OPU 120 directs the light beam to the portion of the Blu-ray disc 101 corresponding to the same cluster to read the cluster again.

Similar to the first read trial, the OPU 120 generates the electrical signal in response to reading the cluster again. The electrical signal is then processed by the front-end signal processing circuit 130 to extract a second bit stream corresponding to the same cluster stored on the Blu-ray disc 101. The decoding module 140 performs cluster decoding on the second bit stream to detect and correct errors. For example, the decoding module 140 decodes codewords in the second bit stream according to the Reed-Solomon code, and then performs error detecting code checking in sectors according to the error detecting code in each sector.

When all of the 32 sectors from the second cluster decoding pass the error detection, the cluster formed by the sectors is provided to the devices 150 that are downstream of the decoding module 140. When at least one sector fails the error detecting code checking, in an embodiment, the decoding module 140 combines the decoded codewords from the first cluster decoding and the decoded codewords from the second cluster decoding based on decoding mask of codewords to form combined sectors, such that a sector may include decoded codewords from the first cluster decoding and the decoded codewords from the second cluster decoding. In another embodiment, the decoding module 140 combines the decoded codewords from the first cluster decoding and the second cluster decoding based on decoding mask of codewords and decoding mask of the sectors to form combined sectors.

Further, the decoding module 140 can perform error checking on the combined sectors formed of the decoded codewords from the first cluster decoding and the decoded codewords from the second cluster decoding. When all of the 32 sectors pass the error detecting code checking, the cluster formed by the sectors is provided to the devices 150. When at least one sector has error, the decoding module 140 informs the OPU 120, and the OPU 120 directs the light beam to the portion of the Blu-ray disc 101 corresponding to the same cluster to read the cluster for a third time.

The decoding process can continue until an error free cluster is decoded or until a time for reading the cluster exceeds a limit. When an error free cluster is obtained, the error free cluster is provided to the devices 150. The devices 150 can include any suitable devices for further processing. In an example, the devices 150 include an audio/video decoder, an audio/video interface to an audio/video player, and the like.

According to an embodiment of the disclosure, the decoding module 140 can be implemented as circuits that are integrated on one or more chips.

FIG. 3A shows a block diagram of a decoding module 340 according to an embodiment of the disclosure. The decoding module 340 can be used in the electronic system 100 as the decoding module 140. The decoding module 340 includes a Reed-Solomon decoder 370, an error detecting code checking module 380, a controller 390 and a memory 360. These elements are coupled together as shown in FIG. 3A.

The Reed-Solomon decoder 370 is configured to receive codewords in response to reading a cluster of data. The Reed- Solomon decoder 370 decodes the codewords into decoded codewords based on Reed-Solomon code. According to an aspect of the disclosure, the Reed-Solomon code can detect and correct certain errors, such as random errors, burst errors, and the like. However, when the signal quality in response to reading the cluster is poor, the Reed-Solomon code may fail to correct all the errors in a codeword. When the Reed-Solomon decoder 370 fails to decode a codeword, a flag in association with the codeword is set to indicate fail; and when the Reed-Solomon decoder 370 successfully decodes a codeword, a flag in association with the codeword is set to indicate pass.

The error detecting code checking module 380 receives the decoded codewords, and uses the error detecting code in each sector to check whether the sector has been correctly received and decoded. When all the sectors in the cluster are correctly received and decoded, the cluster is provided to downstream devices, such as the downstream devices 150. However, when at least one of the sectors fails the error detecting code checking, the controller 390 suitably buffers the decoded codewords in the memory 360.

The memory 360 has a portion allocated as a buffer to buffer the decoded codewords for a cluster. In addition, the memory 360 also stores the flags in association with the codewords. In an example, the controller 390 controls the buffer to store those decoded codewords that the corresponding flags are indicative of pass and leave buffer space empty for the decoded codewords that the corresponding flags are indicative of fail. In the FIG. 3A example, each codeword is represented by a column line, and each sector includes codewords 0-8 and one half of a codeword identified by "H". In addition, the memory 360 stores all of the flags in association with the codewords in the cluster. In another example, the controller 390 controls the buffer to store all the decoded codewords and their corresponding flags.

In an embodiment, when at least one of the sectors fails to pass the error detecting code checking, the controller 390 generates a signal to inform, for example the OPU 120, to read the same portion of the Blu-ray disc 101 for a second time.

Similar to the previous cluster decoding, the Reed-Solomon decoder 370 receives codewords in response to reading the cluster of data for the second time. The Reed-Solomon decoder 370 decodes the codewords according to Reed-Solomon code, and sets flags in association with the codewords to indicate codeword decoding pass or fail in the second time.

The error detecting code checking module 380 receives the decoded codewords of the cluster for the second time, and uses the error detecting code in each sector to check whether the sector has been correctly received and decoded. When all the sectors in the cluster are correctly received and decoded, the decoded cluster is provided to downstream devices, such as the downstream devices 150. However, when at least one sector fails the error detecting code checking, the controller 390 uses the stored flags in the first cluster decoding and the flags in the second cluster decoding to combine the decoded codewords from the first cluster decoding and the second cluster decoding in the memory 360.

In an example, a decoded codeword from the second cluster decoding is stored in the memory 360 when the corresponding flag of the codeword for the first cluster decoding is indicative of fail and the flag of the codeword for the second cluster decoding is indicative of pass.

FIG. 3B shows an example to combine the decoded codewords from multiple trials of reading a cluster. In a first trial, some sectors, such as sectors 1, 3, 4, and 6, fail the error detecting code checking and thus the cluster decoding fails. The correctly decoded codewords are buffered and the failed codewords are not buffered. The correctly decoded codewords include all of the codewords in the sectors that pass the error detecting code checking, such as sectors 0, 2, 5 (as shown by shaded sectors). The correctly decoded codewords also include certain codewords in the sectors that fails the error detecting code checking, but the codewords themselves pass the Reed-Solomon decoding, such as the codewords represented by solid lines in the sectors 1, 3, 4 and 6. In the FIG. 3B example, the codewords that fail the Reed-Solomon decoding (as shown by dash lines) are not buffered. The flags that are indicative of pass or fail of the Reed-Solomon decoding for the corresponding codewords are also stored.

In the second trial, some sectors, such as sectors 1, 4, 5, and 6, fail the error detecting code checking and thus the cluster decoding fails. However, some codewords that fail the Reed-Solomon decoding in the first trial have passed the Reed-Solomon decoding in the second trial, such as codewords 1, 4, and 5 in the sector 1, codewords 3, 4, and 5 in sector 3, codewords 0 and 5 in sector 4, and codeword 2 in sector 6, and the like. Those codewords are then buffered, and the corresponding flags are updated to indicate pass.

In an embodiment, an error detecting code checking is then performed on the buffered sectors that combine the codewords from the first trial and the second trial.

It is noted that, in the FIG. 3B example, codeword 8 in sector 4 fails in both trials. The cluster can be read for a third trial, and can be similarly processed as the second trial.

FIG. 4 shows a flowchart outlining a process example 400 executed by the decoding module 340 according to an embodiment of the disclosure. The process starts at S401, and proceeds to S410.

At S410, the decoding module 340 conducts a first trial to read and decode a cluster. Specifically, the Reed-Solomon decoder 370 receives, for a first time, codewords in response to read the cluster, and performs Reed-Solomon decoding on the codewords. Then, the error detecting code checking module 380 performs error detecting code checking on sectors formed of decoded codewords in the first trial.

At S420, the decoding module 340 determines whether the cluster decoding in the first trial passes/fails. For example, when all the sectors in the cluster pass the error detecting code checking, the cluster decoding passes, the process proceeds to S480; otherwise, the process proceeds to S430.

At S430, the codewords that pass the Reed-Solomon decoding are buffered in the memory 360, and flags that indicate the pass or fail of the Reed-Solomon decoding are also stored in the memory 360.

At S440, the decoding module 340 conducts a second trial to read and decode the same cluster. Specifically, the Reed-Solomon decoder 370 receives, for a second time, codewords in response to read the cluster, and performs Reed-Solomon decoding on the codewords. Then, the error detecting code checking module 380 performs error detecting code checking on sectors formed of the decoded codewords in the second trial.

At S450, the decoding module 340 determines whether the cluster decoding in the second trial passes or fails. For example, when all the sectors formed of the decoded codewords in the second trial pass the error detecting code checking, the cluster decoding in the second trial passes, then the process proceeds to S480; otherwise, the process proceeds to S460.

At S460, the codewords that pass the Reed-Solomon decoding in the second trial but fail in the first trial are buffered. In an embodiment, the decoding module 340 uses the stored flags as codeword masking. Specifically, in an example, when a stored flag in association with a codeword is indicative of pass, the codeword is maintained in the memory 360. When a stored flag in association with a codeword is indicative of fail, and the decoding module 340 checks whether the codeword passes the Reed-Solomon decoding in the second trial. If the codeword passes the Reed-Solomon decoding in the second trial, the codeword is buffered in the memory 360, and the corresponding stored flag is updated to indicate pass.

At S470, the decoding module 340 performs the error detecting code checking on the buffered sectors. For example, the error detecting code checking module 380 checks whether the buffered sectors pass the error detecting code checking. When all the sectors in the buffer pass the error detecting code checking, the process proceeds to S480; otherwise, the process returns to S440 to conduct another trial.

At S480, the cluster with error free sectors is provided to downstream devices. Then the process proceeds to S499 and terminates.

Figure 5A:
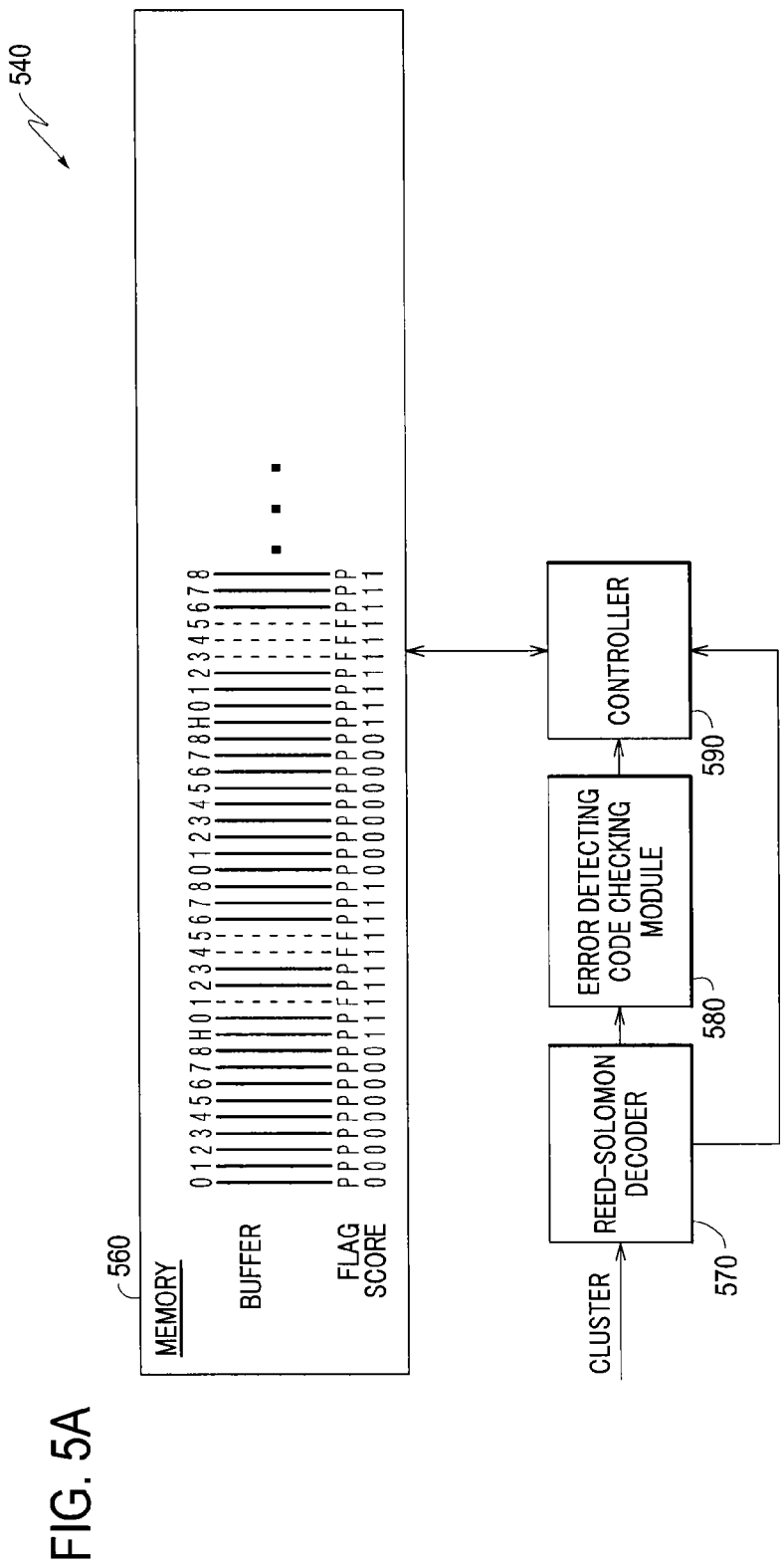
FIG. 5A shows a block diagram of a decoding module 540 according to an embodiment of the disclosure.

FIG. 5A shows a block diagram of a decoding module 540 according to an embodiment of the disclosure. The decoding module 540 can be used in the electronic system 100 as the decoding module 140. The decoding module 540 utilizes certain components that are identical or equivalent to those used in the decoding module 340, such as a Reed-Solomon decoder 570, an error detecting code checking module 580, a controller 590 and a memory 560; the description of these components has been provided above and will be omitted here for clarity purposes. In the FIG. 5A example, in addition to the flags in association with codewords, the memory 560 also stores scores in association with codewords. The scores are determined based on the error detecting code checking of sectors. The decoding module 540 uses the flags as codeword masking and uses the scores as sector masking to combine the decoded codewords from multiple trials in the memory 560.

Figure 5B:
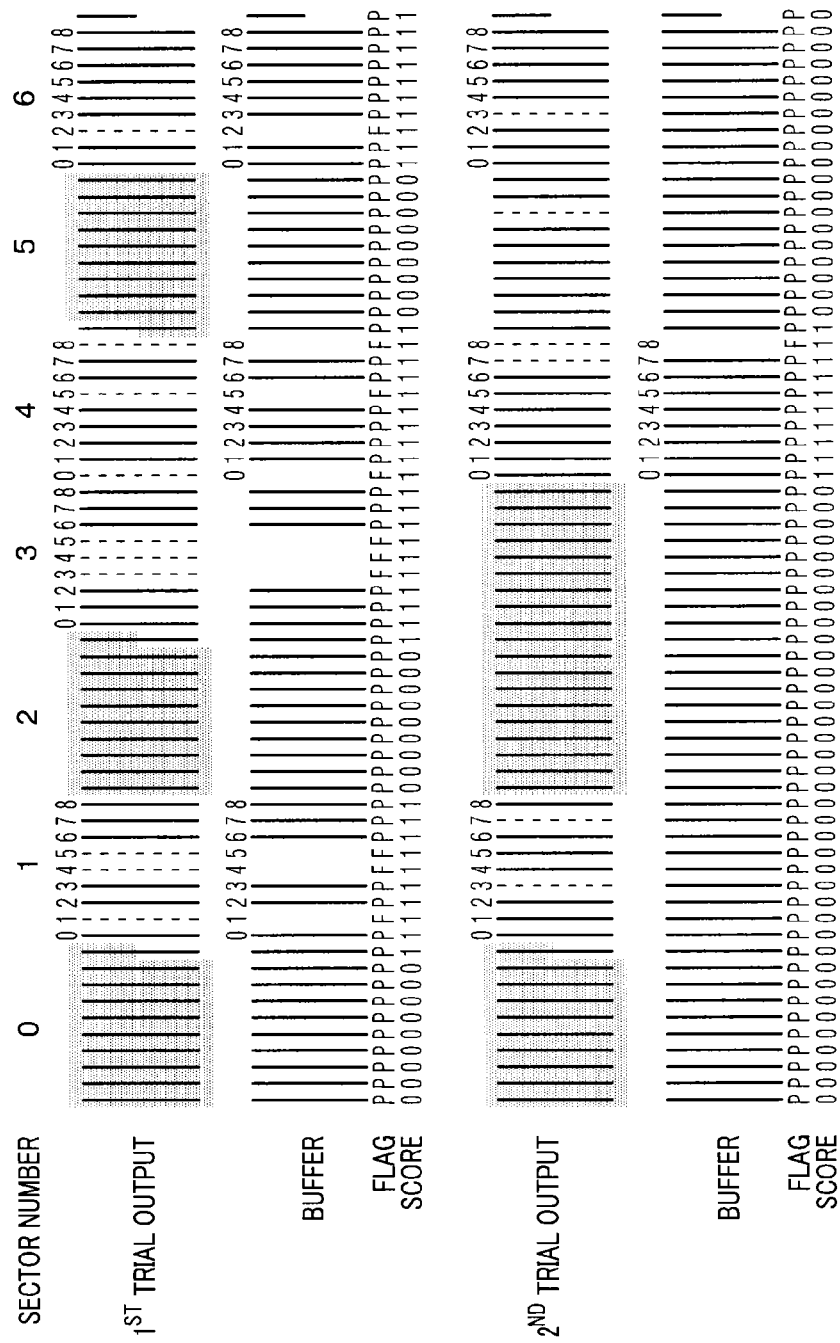
FIG. 5B shows an example for the decoding module 540 to combine the decoded codewords from multiple trials for reading a cluster.

FIG. 5B shows an example to combine the decoded codewords from multiple trials of reading a cluster. In a first trial, some sectors, such as sectors 1, 3, 4, and 6, fail the error detecting code checking and thus the cluster decoding fails. The correctly decoded codewords are buffered and the failed codewords are not buffered. The correctly decoded codewords include all of the codewords in the sectors that pass the error detecting code checking, such as sectors 0, 2, 5 (as shown by shaded sectors). The correctly decoded codewords also include certain codewords in the sectors that fails the error detecting code checking, but the codewords themselves pass the Reed-Solomon decoding, such as the codewords represented by solid lines in the sectors 1, 3, 4 and 6. In the FIG. 5B example, the codewords that fail Reed-Solomon decoding (as shown by dash lines) are not buffered. The flags in association with the codewords that are indicative of pass or fail of the Reed-Solomon decoding are also stored.

In addition, scores in association with the codewords are determined to indicate sector pass or fail in the error detecting code checking. For example, when a sector passes the error detecting code checking, scores for the codewords 0-8 of the sector are set to be zero; and when a sector fails the error detection checking, scores for codewords 0-8 are set to be one. For the shared codeword between two sectors, when one of the sectors fails the error detecting code checking, the score for the codeword is set to one; and when both sectors pass the error detecting code checking, the score for the codeword is set to zero.

In the second trial, some sectors, such as sectors 1, 4, 5, and 6, fail the error detecting code checking and thus the cluster decoding fails. However, some sectors that fail the error detecting code checking in the first trial have passed the error detecting code checking in the second trial, such as sector 3, and the like. All of the codewords in those sectors are then buffered in the memory 560. When a sector fails the error detecting code checking in both of the first trial and the second trial, the codewords in the sector are buffered according to flags in a similar manner as the example in FIG. 3B.

According to an aspect of the disclosure, an error detecting code checking is then performed on the buffered sectors that combine the codewords from the first trial and the second trial. When the buffered sectors all pass the error detecting code checking, the cluster formed of the buffered sectors can be output to downstream devices.

In the FIG. 5B example, codeword 8 in sector 4 fails in both trials, and thus the buffered sector 4 still fails the error detecting code checking. The cluster can be read in a third trial, and can be similarly processed as the second trial.

Figure 6A:
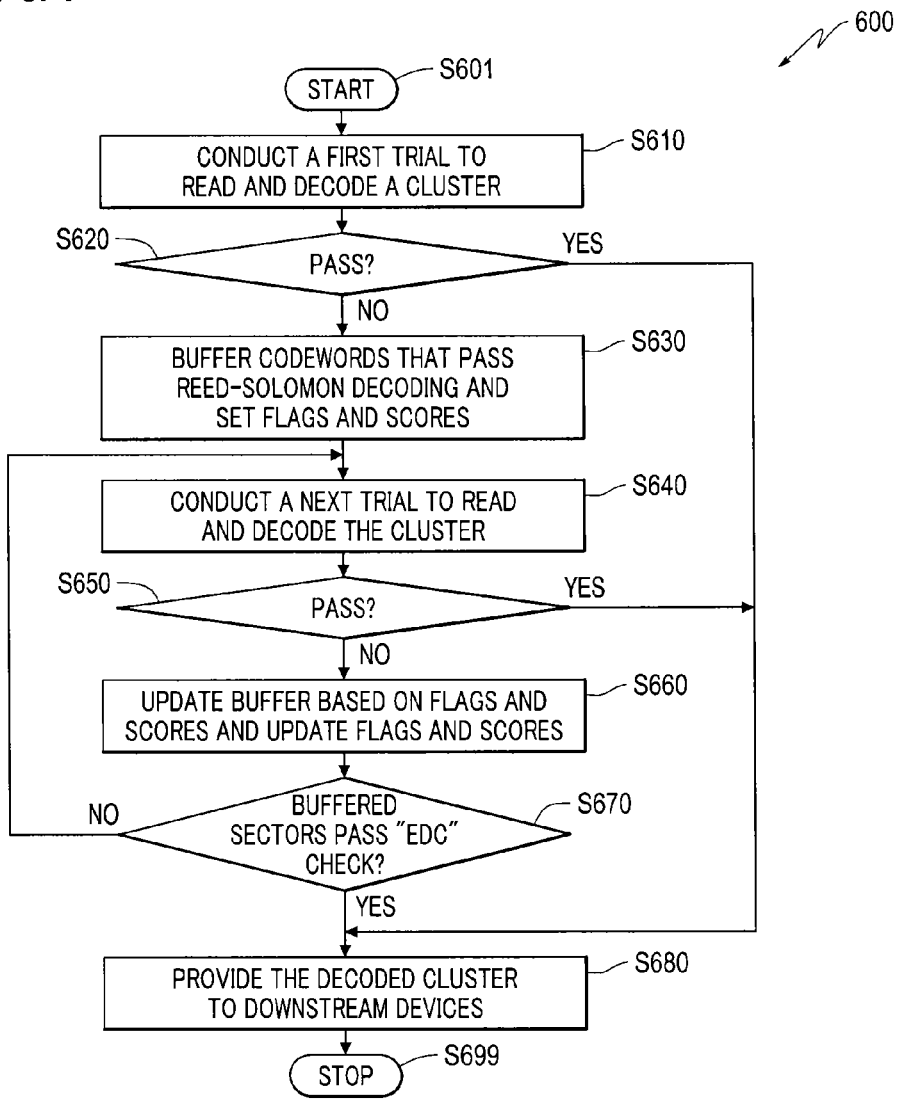
FIGS. 6A and 6B show a flowchart outlining a process example 600 according to an embodiment of the disclosure.

FIG. 6A shows a flowchart outlining a process example 600 executed by the decoding module 540 according to an embodiment of the disclosure. The process starts at S601, and proceeds to S610.

At S610, the decoding module 540 conducts a first trial to read and decode a cluster. Specifically, the Reed-Solomon decoder 570 receives, for a first time, codewords in response to read the cluster, and performs Reed-Solomon decoding on the codewords. Then, the error detecting code checking module 580 performs error detecting code checking on sectors formed of decoded codewords in the first trial.

At S620, the decoding module 540 determines whether the cluster decoding in the first trial passes/fails. For example, when all the sectors in the cluster pass the error detecting code checking, the cluster decoding passes, the process proceeds to S680; otherwise, the process proceeds to S630.

At S630, the codewords that pass the Reed-Solomon decoding are buffered in the memory 560, and flags that indicate the pass or fail of the Reed-Solomon decoding are also stored in the memory 560. In addition, scores that are determined based on the error detecting code checking of sectors are also stored in the memory 560 in association with the codewords.

At S640, the decoding module 540 conducts a second trial to read and decode the same cluster. Specifically, the Reed-Solomon decoder 570 receives, for a second time, codewords in response to read the cluster, and performs Reed-Solomon decoding on the codewords. Then, the error detecting code checking module 580 performs error detecting code checking on sectors formed of the decoded codewords in the second trial.

At S650, the decoding module 540 determines whether the cluster decoding in the second trial passes or fails. For example, when all the sectors formed of the decoded codewords in the second trial pass the error detecting code checking, the cluster decoding in the second trial passes, then the process proceeds to S680; otherwise, the process proceeds to S660.

At S660, the buffer is updated based on flags and scores in the first trial and the second trial. The stored flags and scores are also updated. A detail example of S660 is shown in FIG. 6B.

At S670, the decoding module 540 performs the error detecting code checking on the buffered sectors. For example, the error detecting code checking module 580 checks whether the buffered sectors pass the error detecting code checking. When all the sectors in the buffer pass the error detecting code checking, the process proceeds to S680; otherwise, the process returns to S640 to conduct another trial.

At S680, the cluster with error free sectors is provided to downstream devices. Then the process proceeds to S699 and terminates.

Figure 6B:
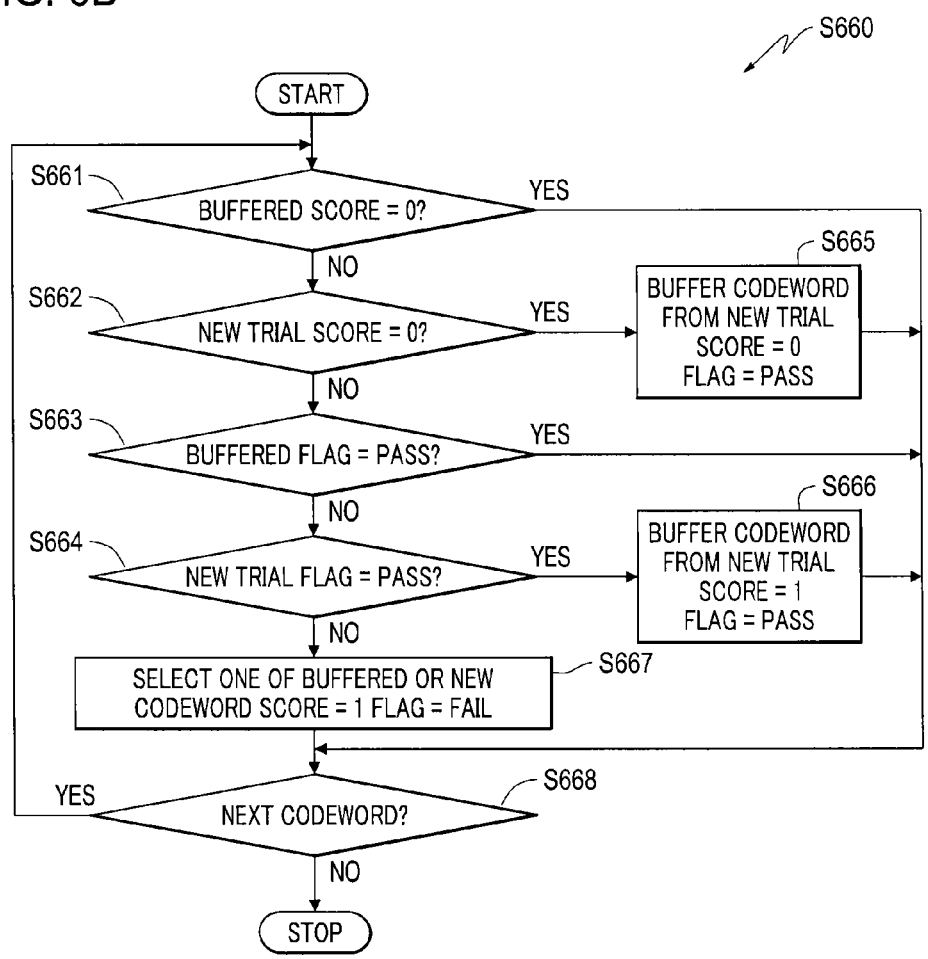

FIG. 6B shows a flowchart outlining detail example of S660 according to an embodiment of the disclosure. In S660, each codeword in the buffer is updated based on corresponding flags and scores in the first trial and the second trial. The stored flag and score in association with the codeword are also updated. The process S660 starts and proceeds to S661.

At S661, the decoding module 540 determines whether a buffered score for a codeword is zero. When the buffered score is zero, the buffered codeword is maintained and the process proceeds to S668; otherwise, the process proceeds to S662.

At S662, the decoding module 540 determines whether a score for the codeword in the new trial is zero. When the score in the new trial is zero, the process proceeds to S665; otherwise, the process proceeds to S663.

At S663, the decoding module 540 determines whether a buffered flag for the codeword is indicative of pass. When the buffered flag is indicative of pass, the buffered codeword is maintained and the process proceeds to S668; otherwise, the process proceeds to S664.

At S664, the decoding module 540 determines whether a flag for the codeword in the new trial is indicative of pass. When the flag in the new trial is indicative of pass, the process proceeds to S666; otherwise, the process proceeds to S667.

At S665, the decoding module 540 stores the decoded codeword from the new trial in the buffer, updates the corresponding score in the memory 560 to zero, and updates the corresponding flag in the memory 560 to indicate of pass. Then, the process proceeds to S668.

At S666, the decoding module 540 buffers the decoded codeword from the new trial in the buffer, updates the corresponding score in the memory 560 to one, and updates the corresponding flag in the memory 560 to indicate pass. Then, the process proceeds to S668.

At S667, the decoding module can selectively maintain the buffered codeword, or can store the codeword from the new trial in the buffer. The corresponding score in the memory 560 for the codeword is set to one, and the corresponding flag in the memory 560 for the codeword is set to indicate fail.

At S668, the decoding module 540 determines whether all the codewords in the cluster have been processed. When there exists a codeword that has not been processed, the process returns to S661 to process the codeword; otherwise, the process S660 terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
   a decoder configured to receive first codewords and decode the first codewords based on a first error correcting code, and to receive second codewords and decode the second codewords based on a second error correcting code;
   an error checking module configured to error-check first portions using a first error detecting code in the first portions, each first portion being formed of a plurality of decoded first codewords, and to error-check second portions using a second error detecting code in the second portions, each second portion being formed of a plurality of decoded second codewords; and
   a controller configured to store in a memory, when the error checking fails for at least one first portion, the decoded first codewords, and to store in the memory, when the error checking of the second portion fails for at least one second portion, the decoded second codewords based on the decoded first codewords stored in the memory so as to combine the decoded first codewords with the decoded second codewords.

2. The circuit of claim 1, wherein the controller is configured to store a decoded second codeword when the decoding of a corresponding first codeword fails.

3. The circuit of claim 1, wherein the error checking module is configured to error-check portions in the memory that combine the decoded first codewords and the decoded second codewords.

4. The circuit of claim 1, wherein the decoder is configured to receive the first and second codewords in response to reading from a Blu-ray disc.

5. The circuit of claim 4, wherein the controller is configured to store scores of the first codewords in the memory that are indicative of pass or fail and that correspond to error-checked first portion.

6. The circuit of claim 5, wherein the controller is configured to store a score of a shared codeword of two portions based on sector error checking of the two portions.

7. A method, comprising:
   receiving first codewords and second codewords;
   decoding the first codewords the second codewords based on an error correcting code;
   error-checking first portions using a first error detecting code in first portions, each first portion or being formed of a plurality of decoded first codewords;
   error-checking second portions using second error detecting code in second portions, each second portion being formed of a plurality of decoded second codewords;
   storing in a memory the decoded codewords when the error checking fails for at least one portion; and
   combining the decoded second codewords in the memory with the decoded first codewords when the error checking of the second portions fails for at least one second portion.

8. The method of claim 7, wherein combining the decoded second codewords in the memory with the decoded first codewords when the error checking of the second portions fails for at least one portion further comprises:
   storing a decoded second codeword when the decoding of a corresponding first codeword fails.

9. The method of claim 7, further comprising:
   error-checking portions in the memory that combines the decoded first codewords and the decoded second codewords.

10. The method of claim 7, wherein receiving the first and second codewords further comprises:
    receiving the first and second codewords in response to reading a Blu-ray disc.

11. The method of claim 10, further comprising:
    storing scores of the codewords in the memory that are indicative of pass or fail and that correspond to error-checked portions.

12. The method of claim 11, further comprising:
    storing a score for a shared codeword by two portions based on portion error checking of the two portions.

13. An apparatus, comprising:
    an optical pickup unit configured to generate an electrical signal in response to reading a Blu-ray disc;

a decoder configured to receive first codewords extracted from the electrical signal and decode the first codewords based on a first error correcting code, and to receive second codewords and decode the second codewords based on a second error correcting code;

an error checking module configured to error-check first portions using a first error detecting code in the first portions, each first portion being formed of a plurality of decoded first codewords, and to error-check second portions using a second error detecting code in the second portions, each second portion being formed of a plurality of decoded second codewords; and a controller configured to store in a memory, when the error checking fails for at least one first portion, the decoded first codewords, and to combine, when the error checking of the second portion fails for at least one second portion, the decoded first codewords with the decoded second codewords based on the decoded first codewords stored in the memory.

14. The apparatus of claim 13, wherein the controller is configured to store a decoded second codeword when the decoding of a corresponding first codeword fails.

15. The apparatus of claim 13, wherein the error checking module is configured to error-check portions in the memory that combine the decoded first codewords and the decoded second codewords.

16. The apparatus of claim 13, wherein the controller is configured to store scores of the codewords in the memory that are indicative of pass or fail and that correspond to error-checked portion.

17. The apparatus of claim 16, wherein the controller is configured to store a score of a shared codeword of two portions based on sector error checking of the two portions.

* * * * *